(12) United States Patent
Ohtsuki et al.

(10) Patent No.: US 9,595,472 B1
(45) Date of Patent: Mar. 14, 2017

(54) SEMICONDUCTOR DEVICE, AND MANUFACTURING METHOD OF SEMICONDUCTOR DEVICE

(71) Applicant: Kabushiki Kaisha Toshiba, Minato-ku (JP)

(72) Inventors: Takuya Ohtsuki, Yokkaichi (JP); Takashi Ohashi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/950,194

(22) Filed: Nov. 24, 2015

(30) Foreign Application Priority Data

Sep. 11, 2015 (JP) .................. 2015-180183

(51) Int. Cl.
- *H01L 21/027* (2006.01)
- *H01L 21/768* (2006.01)
- *H01L 23/528* (2006.01)
- *H01L 23/532* (2006.01)

(52) U.S. Cl.
CPC .... *H01L 21/76892* (2013.01); *H01L 21/7682* (2013.01); *H01L 23/528* (2013.01); *H01L 23/5329* (2013.01); *H01L 23/53204* (2013.01)

(58) Field of Classification Search
None
See application file for complete search history.

(56) References Cited

U.S. PATENT DOCUMENTS

| 5,698,462 A | * | 12/1997 | Sasaki | H01L 23/552 257/E21.597 |
| 7,906,434 B2 | | 3/2011 | Hashimoto et al. | |
| 2007/0051970 A1 | * | 3/2007 | Jang | B81B 3/0086 257/108 |
| 2008/0008969 A1 | * | 1/2008 | Zhou | H01L 21/0337 430/313 |
| 2011/0059405 A1 | | 3/2011 | Sho | |
| 2013/0189483 A1 | * | 7/2013 | Reinmuth | H05K 13/00 428/137 |

FOREIGN PATENT DOCUMENTS

| JP | 2005-175033 | 6/2005 |
| JP | 2011-60813 | 3/2011 |
| JP | 4756063 | 8/2011 |

* cited by examiner

*Primary Examiner* — Fei Fei Yeung Lopez
(74) *Attorney, Agent, or Firm* — Oblon, McClelland, Maier & Neustadt, L.L.P.

(57) ABSTRACT

According to one embodiment, a manufacturing method of a semiconductor device comprises forming a first pattern and a second pattern to be placed apart on a semiconductor substrate; and forming an arch pattern in which the tops of the first pattern and of the second pattern touch by making the first pattern and the second pattern bend in directions in which they face each other.

10 Claims, 5 Drawing Sheets

SEMICONDUCTOR DEVICE, AND
MANUFACTURING METHOD OF
SEMICONDUCTOR DEVICE

CROSS-REFERENCE TO RELATED APPLICATIONS

This application is based upon and claims the benefit of priority from Japanese Patent Application No. 2015-180183, filed on Sep. 11, 2015; the entire contents of which are incorporated herein by reference.

FIELD

Embodiments described herein relate generally to a semiconductor device and a manufacturing method of the semiconductor device.

BACKGROUND

There is a method which uses a sidewall process in order to form line pattern whose width is less than or equal to the resolution limit of lithography. With this sidewall process, line widths become the same, and if line pattern of different line widths are to be formed, patterning needs to be performed again.

DETAILED DESCRIPTION

According to one embodiment, a manufacturing method of a semiconductor device comprises forming a first pattern and a second pattern to be placed apart on a semiconductor substrate; and forming an arch pattern in which the tops of the first pattern and of the second pattern touch by making the first pattern and the second pattern bend in directions in which they face each other.

The semiconductor devices according to embodiments will be described in detail below with reference to the accompanying drawings. The present invention is not limited to these embodiments.

First Embodiment

FIGS. 1A to 1C, 2A to 2C, 3A to 3C, and 3A' are cross-sectional views showing a manufacturing method of a semiconductor device according to the first embodiment.

Figure 1A:
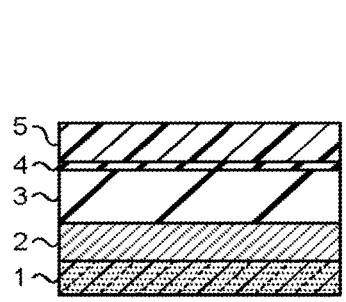
FIGS. 1A to 1C are cross-sectional views showing a manufacturing method of a semiconductor device according to a first embodiment.

In FIG. 1A, a processing layer 2, a mask layer 3, an intermediate layer 4, and a core layer 5 are sequentially formed one over another on a base layer 1. The base layer 1 and the processing layer 2 may be a semiconductor substrate, an insulator film such as a silicon oxide film or a silicon nitride film, a semiconductor film of amorphous silicon, poly-silicon, or the like, or a metal film of Al, Cu, or the like. The mask layer 3 may be an organic film such as a resist film, an Insulator film such as a silicon oxide film or a silicon nitride film, or a semiconductor film of amorphous silicon, poly-silicon, or the like. As the intermediate layer 4, an insulator film such as a silicon oxide film, or the like can be used, and if unnecessary, it does not have to be provided. As the core layer 5, a resist film or the like can be used.

Figure 1B:
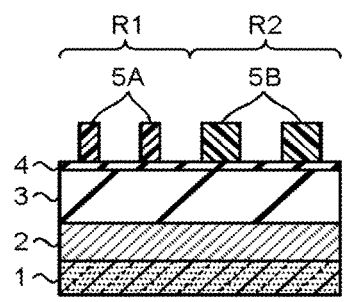

Then, as shown in FIG. 1B, the core layer 5 is patterned using a photolithography technique to form core patterns 5A, 5B on the intermediate layer 4. The core patterns 5A, 5B can be lines & spaces. The width of the core patterns 5B can be set larger than the width of the core patterns 5A. The core patterns 5A can be placed in a region R1, and the core patterns 5B in a region R2. The device formed in the region R1 can be made finer than the device formed in the region R2. For example, the memory cell array of a NAND flash memory can be formed in the region R1, and peripheral circuits of the memory cell array in the region R2.

Figure 1C:
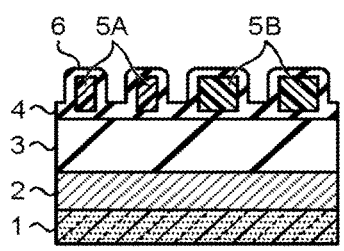

Then, a sidewall layer 6 is formed on the intermediate layer 4 so as to cover the core patterns 5A, 5B by a method such as CVD as shown in FIG. 1C. For the sidewall layer 6, a material lower in etching rate than that of the core layer 5 can be selected. For example, where the core layer 5 is a resist film, an inorganic film such as a silicon oxide film can be used as the sidewall layer 6.

Figure 2A:
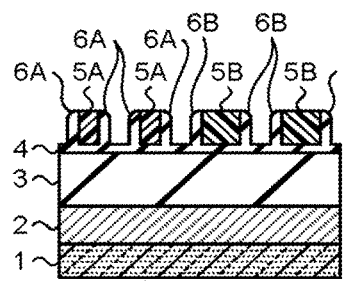
FIGS. 2A to 2C are cross-sectional views showing the manufacturing method of the semiconductor device according to the first embodiment.

Then, the sidewall layer 6 is made thinner and thinner by anisotropic etching such as RIE until the surfaces of the core patterns 5A, 5B become exposed as shown in FIG. 2A, thereby forming sidewall patterns 6A, 6B on the sidewalls of the core patterns 5A, 5B respectively.

Note that the line width of the sidewall patterns 6A, 6B can be set to be less than the resolution limit of photolithography.

Figure 2B:
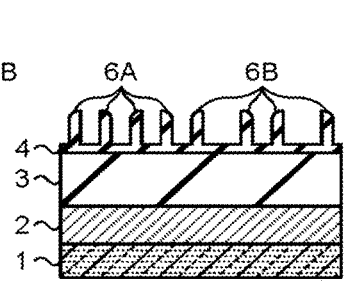

Then, the core patterns 5A, 5B are etched by a method such as dry etching or wet etching, thereby removing the core patterns 5A, 5B between the sidewall patterns 6A, 6B as shown in FIG. 2B.

Figure 2C:
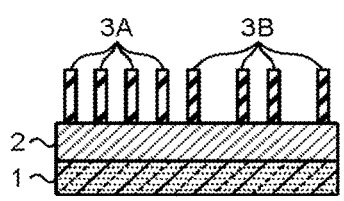

Then the intermediate layer 4 and the mask layer 3 are etched with the sidewall patterns 6A, 6B as a mask as shown in FIG. 2C, thereby forming mask patterns 3A, 3B on the processing layer 2.

Figures 3A, 3B, 3C:
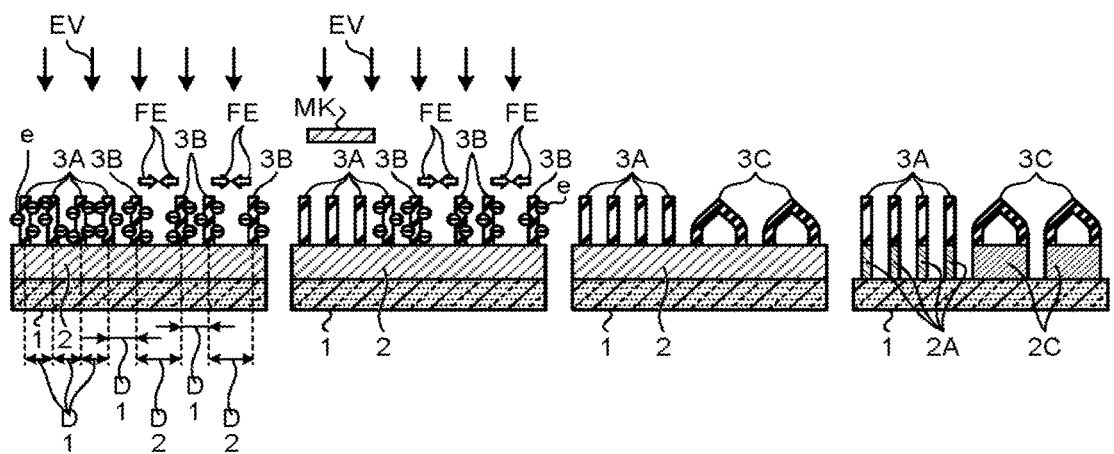
FIGS. 3A to 3C and 3A' are cross-sectional views showing the manufacturing method of the semiconductor device according to the first embodiment.

Then, an electron beam EV is irradiated onto the mask patterns 3A, 3B as shown in FIG. 3A, thereby charging the mask patterns 3A, 3B with electric charges e. At this time, Coulomb forces based on the electric charges e occur between the mask patterns 3A, 3B. Between the mask patterns 3B, narrow distances D1 and wide distances D2 are alternately set. With the narrow distance D1, a repulsive force exerted between the mask patterns 3B is larger than with the wide distance D2. Therefore, such a repulsive force FE occurs between the mask patterns 3B that they bend toward the wide distances D2. Note that a length measurement SEM (CD-SEM: Critical Dimension-Scanning Electron Microscope), a cross-section SEM, or the like can be used to irradiate the electron beam EV onto the entire surface.

As shown in FIG. 3A', a shielding plate MK may be placed halfway in the irradiation path of the electron beam EV so that the electron beam EV is not irradiated onto the mask patterns 3A, which do not contribute to the occurrence of the repulsive force FE. Note that in order to locally irradiate the electron beam EV, an electron beam drawing apparatus or the like may be used.

At this time, as shown in FIG. 3B, since the mask patterns 3B bend toward the wide distances D2, the tops of the mask patterns 3B facing each other with the distance D2 in between, touch each other, so that arch patterns 3C are formed on the processing layer 2.

Then the processing layer 2 is etched with the mask patterns 3A and the arch patterns 3C as a mask, thereby forming processed patterns 2A, 2C on the base layer 1 as shown in FIG. 3C. At this time, the line width of the processed patterns 2C can be made larger than that of the processed patterns 2A. For example, the line width of the processed patterns 2A can be set to be less than the resolution limit of photolithography. The line width of the processed patterns 2C can be set to be greater than or equal to the resolution limit of photolithography.

Because the mask patterns 3A and the arch patterns 3C are formed on the processing layer 2 to form the processed patterns 2A, 2C, there is no need to perform photolithography corresponding to the line width of the processed patterns 2C, so that the number of times of photolithography can be reduced.

Second Embodiment

FIGS. 4A to 4C, 5A to 5C, 6A to 6C, and 7A to 7C are cross-sectional views showing a manufacturing method of a semiconductor device according to the second embodiment.

Figures 4A, 4B, 4C:
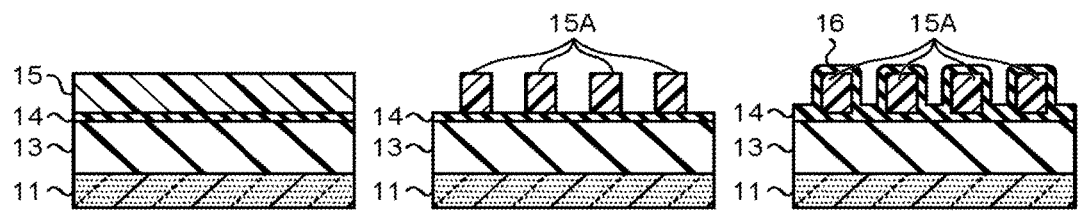
FIGS. 4A to 4C are cross-sectional views showing a manufacturing method of a semiconductor device according to a second embodiment.

In FIG. 4A, a sacrifice layer 13, an intermediate layer 14, and a core layer 15 are sequentially formed one over another on a base layer 11. The base layer 11 may be a semiconductor substrate, an insulator film such as a silicon oxide film or a silicon nitride film, a semiconductor film of amorphous silicon, poly-silicon, or the like, or a metal film of Al, Cu, or the like. The sacrifice layer 13 may be an organic film such as a resist film, an insulator film such as a silicon oxide film or a silicon nitride film, or a semiconductor film of amorphous silicon, poly-silicon, or the like. As the intermediate layer 14, an insulator film such as a silicon oxide film, or the like can be used, and if unnecessary, it does not have to be provided. As the core layer 15, a resist film or the like can be used.

Then, as shown in FIG. 4B, the core layer 15 is patterned using a photolithography technique to form core patterns 15A on the intermediate layer 14. The core patterns 15A can be lines & spaces.

Then, a sidewall layer 16 is formed on the intermediate layer 14 so as to cover the core patterns 15A by a method such as CVD as shown in FIG. 4C. For the sidewall layer 16, a material lower in etching rate than that of the core layer 15 can be selected. For example, where the core layer 15 is a resist film, an inorganic film such as a silicon oxide film can be used as the sidewall layer 16.

Figures 5A, 5B, 5C:
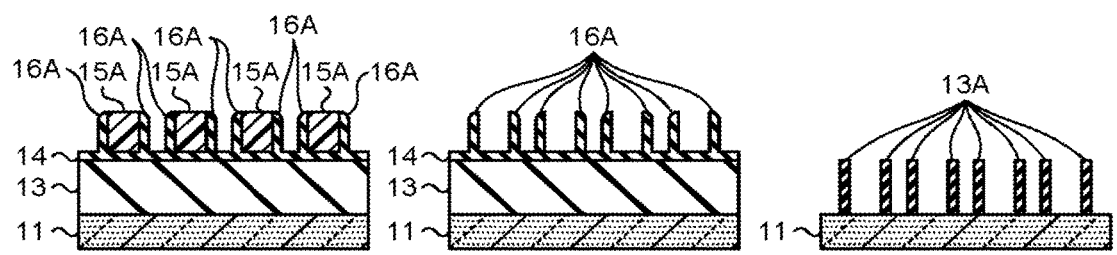
FIGS. 5A to 5C are cross-sectional views showing the manufacturing method of the semiconductor device according to the second embodiment.

Then, the sidewall layer 16 is made thinner and thinner by anisotropic etching such as RIE until the surfaces of the core patterns 15A become exposed as shown in FIG. 5A, thereby forming sidewall patterns 16A on the sidewalls of the core patterns 15A.

Then, the core patterns 15A are etched by a method such as dry etching or wet etching, thereby removing the core patterns 15A between the sidewall patterns 16A as shown in FIG. 5B.

Then the intermediate layer 14 and the sacrifice layer 13 are etched with the sidewall patterns 16A as a mask, thereby forming vertical patterns 13A on the base layer 11 as shown in FIG. 5C.

Figures 6A, 6B, 6C:
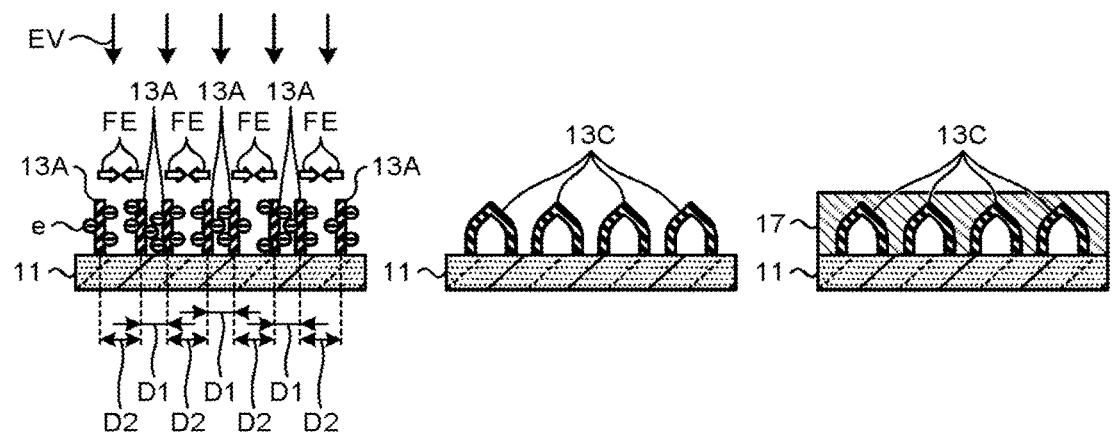
FIGS. 6A to 6C are cross-sectional views showing the manufacturing method of the semiconductor device according to the second embodiment.

Then, an electron beam EV is irradiated onto the vertical patterns 13A as shown in FIG. 6A, thereby charging the vertical patterns 13A with electric charges e. At this time, Coulomb forces based on the electric charges e occur between the vertical patterns 13A. Between the vertical patterns 13A, narrow distances D1 and wide distances D2 are alternately set. With the narrow distance D1, a repulsive force exerted between the vertical patterns 13A is larger than with the wide distance D2. Therefore, such a repulsive force FE occurs between the vertical patterns 13A that they bend toward the wide distances D2.

At this time, as shown in FIG. 6B, since the vertical patterns 13A bend toward the wide distances D2, the tops of the vertical patterns 13A facing each other with the distance D2 in between, touch each other, so that arch patterns 13C are formed on the base layer 11.

Then a conductor 17 is deposited on the base layer 11 to cover the entire arch patterns 13C by a method such as CVD or sputtering as shown in FIG. 6C. The conductor 17 may be a metal film of Al, Cu, or the like or a semiconductor film of amorphous silicon, poly-silicon, or the like doped with an impurity.

Figure 7A:
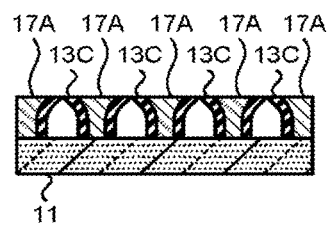
FIGS. 7A to 7C are cross-sectional views showing the manufacturing method of the semiconductor device according to the second embodiment.

Then the conductor 17 is made thinner and thinner by a method such as CMP (Chemical Mechanical Polishing) until the arch patterns 13C become exposed as shown in FIG. 7A. At this time, the conductor 17 is divided into parts to form a conductive layer 17A. This conductive layer 17A can be used as wires, electrodes, and the like. When the arch patterns 13C is exposed, the top of each arch pattern feature 13C may be closed or open.

Figure 7B:
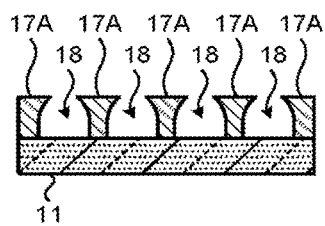

Then, the arch patterns 13C are etched by a method such as dry etching or wet etching, thereby removing the arch patterns 13C between the parts of the conductive layer 17A as shown in FIG. 7B. Here, air gaps 18 can be provided between the parts of the conductive layer 17A.

Figure 7C:
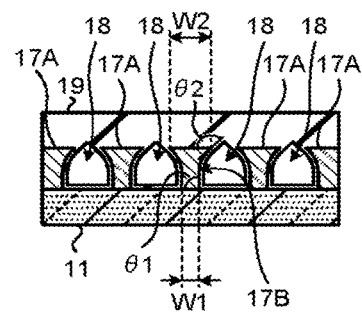

Then, an insulating layer 19 is formed on the conductive layer 17A by a method such as plasma CVD as shown in FIG. 7C. For example, a silicon oxide film or the like can be used as the insulating layer 19. Here, the air gaps 18 can be made not to disappear due to the insulating layer 19. Further, the width W2 of the top of each part of the conductive layer 17A can be made larger than the width W1 of the bottom. Yet further, the inclination angle θ2 of a side surface 17B of the top of each part of the conductive layer 17A relative to the base layer 11 can be made larger than the inclination angle θ1 of the side surface 17B of the bottom. The inclination angle θ2 can be made to gradually increase when going from the bottom of the conductive layer 17A toward the top. In this case, the cross-section of each part of the conductive layer 17A may be in a funnel shape or a bugle shape or a bell shape.

Here, by forming the air gaps 18 between the parts of the conductive layer 17A, electrical interference between the parts of the conductive layer 17A can be reduced. Further, by filling the conductor 17 between the arch patterns 13C, the number of process steps necessary to form the air gaps 18 can be reduced.

Although the above embodiments describe the method that irradiates an electron beam EV to form the arch patterns 3C, 13C, the present invention not being limited to the method that irradiates an electron beam EV, a 3D printer or the like may be used.

Third Embodiment

Figure 8:
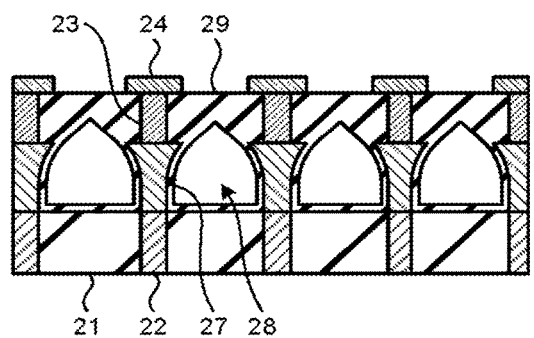
FIG. 8 is a cross-sectional view showing schematically the configuration of a semiconductor device according to a third embodiment.

FIG. 8 is a cross-sectional view showing schematically the configuration of a semiconductor device according to the third embodiment.

In FIG. 8, contact plugs 22 are embedded in an insulating layer 21. Lower layer wires 27 are formed on the contact plugs 22. Air gaps 28 are provided between the lower layer wires 27. An insulating layer 29 is formed over the lower layer wires 27 such that the air gaps 28 do not disappear. Contact plugs 23 are embedded in the insulating layer 29 and on the lower layer wires 27. Upper layer wires 24 are formed on the contact plugs 23.

The lower layer wires 27 can take the same cross-section shape as the parts of the conductive layer 17A of FIG. 7C. The air gaps 28 can take the same cross-section shape as the air gaps 18 of FIG. 7C.

By making the width of the top of the lower layer wire 27 larger than the width of the bottom, if position deviation of the contact plugs 23 occurs, the contact plugs 23 can be prevented from being disconnected from the lower layer wires 27.

Fourth Embodiment

Figure 9:
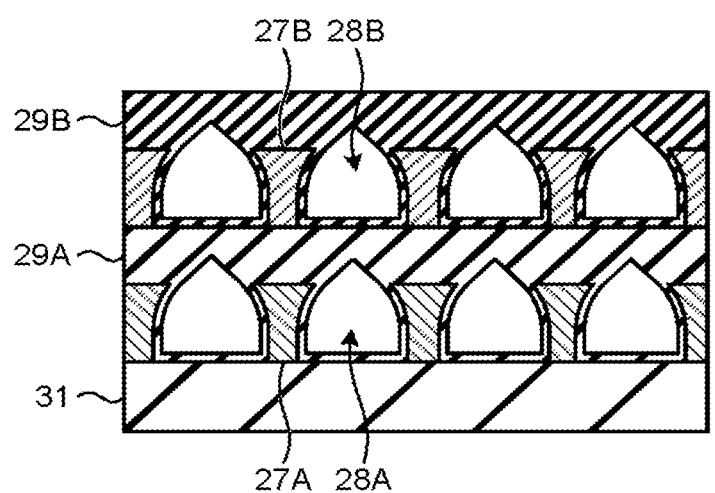
FIG. 9 is a cross-sectional view showing schematically the configuration of a semiconductor device according to a fourth embodiment.

FIG. 9 is a cross-sectional view showing schematically the configuration of a semiconductor device according to the fourth embodiment.

In FIG. 9, lower layer wires 27A are formed on an insulating layer 31. Air gaps 28A are provided between the lower layer wires 27A. An insulating layer 29A is formed over the lower layer wires 27A such that the air gaps 28A do not disappear. Upper layer wires 27B are formed on the insulating layer 29A. Air gaps 28B are provided between the upper layer wires 27B. An insulating layer 29B is formed over the upper layer wires 27B such that the air gaps 28B do not disappear.

The lower layer wires 27A, 27B can take the same cross-section shape as the lower layer wires 27 of FIG. 8. The air gaps 28A, 28B can take the same cross-section shape as the air gaps 28 of FIG. 8.

By repeating the process steps of FIGS. 4A to 4C, 5A to 5C, 6A to 6C, and 7A to 7C, a stacked structure of the air gaps 28A, 28B can be formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:

forming a processing layer on the semiconductor substrate;

forming a first pattern and a second pattern to be placed apart on the processing layer;

forming an arch pattern in which the tops of the first pattern and of the second pattern touch by making the first pattern and the second pattern bend in directions in which they face each other; and forming a line pattern having a line width corresponding to the width of the arch pattern by etching the processing layer with the arch pattern as a mask.

2. The manufacturing method of the semiconductor device of claim 1, wherein the forming the arch pattern comprises charging the first pattern and the second pattern by irradiating charged particles, and wherein the first pattern and the second pattern are made to bend in directions in which they face each other by Coulomb forces exerted on the first pattern and the second pattern.

3. The manufacturing method of the semiconductor device of claim 2, wherein a shielding mask is placed over an area onto which the charged particles are not irradiated.

4. The manufacturing method of the semiconductor device of claim 2, wherein the first pattern and the second pattern are placed not the same distances apart alternately, and wherein the first pattern and the second pattern are made to bend in directions of wider distances by the Coulomb forces.

5. The manufacturing method of the semiconductor device of claim 4, wherein the semiconductor device comprises a first region where a third pattern and a fourth pattern are placed the same distance apart alternately and a second region where the first pattern and the second pattern are placed not the same distances apart alternately, and in the first region, the third pattern and the fourth pattern do not bend, and in the second region, the first pattern and the second pattern bend to form the arch pattern.

6. The manufacturing method of the semiconductor device of claim 5, wherein in the first region, a first line pattern is formed in the processing layer based on the third pattern and the fourth pattern, in the second region, a second line pattern is formed in the processing layer based on the arch pattern, and the second line pattern is thicker in line width than the first line pattern.

7. The manufacturing method of the semiconductor device of claim 6, comprising:

forming a mask layer in the first region and the second region on the processing layer;

forming a core pattern on the mask layer;

forming a sidewall pattern on sidewalls of the core pattern;

removing the core pattern between the sidewall pattern; and etching the mask layer with the sidewall pattern as a mask, thereby forming the first pattern, the second pattern, third pattern and the fourth pattern on the processing layer, wherein the width of the core pattern in the second region is larger than the width of the core pattern in the first region.

8. A manufacturing method of a semiconductor device comprising:
   forming a first pattern and a second pattern to be placed apart on a semiconductor substrate;
   forming an arch pattern in which the tops of the first pattern and of the second pattern touch by making the first pattern and the second pattern bend in directions in which they face each other; and
   forming a conductive layer to cover the arch pattern, wherein both legs of the conductive layer have an arch shape corresponding to the arch pattern.

9. The manufacturing method of the semiconductor device of claim 8,
   comprising making the conductive layer thinner so that the tip of the arch pattern becomes exposed, thereby dividing the conductive layer.

10. The manufacturing method of the semiconductor device of claim 9, comprising:
   after dividing the conductive layer, removing the arch pattern; and
   forming an insulating layer on the conductive layer such that an air gap is formed between the divided conductive layer.

\* \* \* \* \*